(12) United States Patent
Van Der Schoot et al.

(10) Patent No.: US 7,034,924 B2
(45) Date of Patent: Apr. 25, 2006

(54) LITHOGRAPHIC APPARATUS AND DEVICE MANUFACTURING METHOD

(75) Inventors: Harmen Klass Van Der Schoot, Vught (NL); Hernes Jacobs, Eindhoven (NL); Martinus Arnoldus Henricus Terken, Lierop (NL)

(73) Assignee: ASLM Netherlands B.V., Veldhoven (NL)

( * ) Notice: Subject to any disclaimer, the term of this patent is extended or adjusted under 35 U.S.C. 154(b) by 88 days.

(21) Appl. No.: 10/754,634

(22) Filed: Jan. 12, 2004

(65) Prior Publication Data

US 2005/0151945 A1 Jul. 14, 2005

(51) Int. Cl.
*G03B 27/60* (2006.01)

(52) U.S. Cl. .............................. 355/73; 355/72; 355/75; 355/76; 355/77

(58) Field of Classification Search .................. 355/53, 355/67, 71, 73, 76, 72, 75; 310/10, 12, 34, 310/35
See application file for complete search history.

(56) References Cited

U.S. PATENT DOCUMENTS

| 6,188,150 | B1 | 2/2001 | Spence |
| 6,740,891 | B1 | 5/2004 | Driessen et al. |
| 2002/0000029 | A1 | 1/2002 | Emoto |
| 2002/0159046 | A1 | 10/2002 | Binnard et al. |
| 2002/0180946 | A1* | 12/2002 | Bisschops et al. ............ 355/72 |

FOREIGN PATENT DOCUMENTS

EP  1 211 562 A1  6/2002

* cited by examiner

*Primary Examiner*—Michael Tokar
*Assistant Examiner*—Vivian Nelson
(74) *Attorney, Agent, or Firm*—Pillsbury Winthrop Shaw Pittman LLP

(57) ABSTRACT

A lithographic apparatus includes at least one object support structure in a high vacuum chamber. The object support structure includes a carrier device in which a number of dividing walls are provided forming a number of compartments in the carrier device. At least one of the compartments is shielded from the high vacuum chamber and is provided with separate gas evacuating structures.

17 Claims, 3 Drawing Sheets

US 7,034,924 B2

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Brief Description of Related Art

A lithographic apparatus is a machine that applies a desired pattern onto a target portion of a substrate. Lithographic apparatus can be used, for example, in the manufacture of integrated circuits (IC's). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In particular in a lithographic apparatus using a projection beam of radiation in the extreme ultraviolet (EUV) range or a particle beam, it is necessary to operate in high vacuum in order to prevent undesirable phenomena, like for instance absorption and/or scattering of the beam of radiation as a result of the presence of gas molecules in the lithographic apparatus, and deposition of contaminants onto surfaces of optical devices. Thus, in such lithographic apparatus as presently known in the art, the substrate and/or patterning devices are located in a vacuum chamber in which, in operation, a high vacuum is maintained. As a consequence, in a practical embodiment of a lithographic apparatus, a support structure for the substrate and/or a support structure for the patterning device, or a number of such support structures in case of a multiple stage apparatus, as well as positioning structures associated with the support structures, will be located in a vacuum chamber.

For the sake of completeness it is noted that in this specification the expression "high vacuum" indicates a very low pressure. Similarly the expression "low vacuum" indicates a relatively high but still sub-atmospheric pressure.

Use of a high vacuum imposes rather severe requirements on the components that are put into the vacuum. Such components should be constructed from materials which in vacuum will feature no, or only a minimum of, outgassing of contaminants. In this connection the expression "outgassing" includes both outgassing from the materials as such and from gases adsorbed on their surfaces.

The support structures for the patterning device and the substrate in a lithographic apparatus are of a rather complicated design, employing various auxiliary elements like, for instance, sensors, sensor electronics, positioning structures, electric wiring and conduits for cooling purposes and the like. For all such elements, when used in a high vacuum, special materials may be used in order to minimize the outgassing problem indicated above. The necessity of using such elements, especially designed for a high vacuum environment, does not only result in high costs in connection with manufacturing and/or purchasing and maintaining a working stock of such elements, but also limits the freedom of design for such elements.

SUMMARY

One aspect of the present invention is to provide a lithographic apparatus with substantially reduced problems due to outgassing of materials in a high vacuum chamber.

According to an aspect of the invention, there is provided a lithographic apparatus comprising: an illumination system constructed to provide a beam of radiation; at least one first object support structure constructed to support a patterning device, the patterning device serving to impart a cross-section of the beam with a pattern to form a patterned beam; at least one second object support structure constructed to support a substrate; a projection system that projects the patterned beam onto a target portion of the substrate; and at least one main vacuum chamber provided with a first gas evacuating structure to provide a high vacuum, the main vacuum chamber enclosing at least one of the first and second support structures and enclosing positioning structures having at least one positioning device and associated with at least one of the first and second support structures, wherein the at least one of the first and second support structures in the main vacuum chamber includes a carrier device connected to the at least one positioning device and being within the main vacuum chamber, wherein the carrier device includes at least one compartment shielded from the high vacuum of the main vacuum chamber and being provided with a further gas evacuating structure allowing, in operation in the at least one compartment, at least one vacuum level which is different from the high vacuum in the main vacuum chamber.

According to a further aspect of the invention, a method of manufacturing a device is provided comprising: providing a beam of radiation; imparting a cross-sectional pattern to the beam and forming a patterned beam of radiation while a first object support structure supports a patterning device; projecting the patterned beam onto a target portion of a substrate supported by a second object support structure; providing a high vacuum within at least one main vacuum chamber, the main vacuum chamber enclosing at least one of the first and second object support structures and enclosing a positioning structure having at least one positioning device and associated with at least one of the first and second object support structures; positioning a carrier device, included within one of the first and second object support structures, to position the carrier device in the main vacuum chamber, providing at least one vacuum level which is different from the high vacuum in the main vacuum chamber within at least one compartment within the carrier device that is shielded from the high vacuum of the main vacuum chamber.

A carrier device having at least one compartment shielded from the high vacuum in the vacuum chamber and having its own gas evacuating structure makes it possible to use a lower vacuum level (corresponding to a higher pressure) in the compartment. Outgassing problems with respect to auxiliary devices mounted in such compartment will considerably be reduced in such a dual vacuum carrier device. This will make it possible to avoid at least to a large extent the use of expensive and difficult to obtain non-standard elements.

According to a further aspect of the invention, a lithographic apparatus is provided comprising: means for providing a beam of radiation; pattern-forming means for imparting a cross-sectional pattern to the beam of radiation to form a patterned beam; first supporting means for supporting the pattern-forming means; a substrate; second supporting means for supporting the substrate; means for projecting the patterned beam onto a target portion of the substrate; means for carrying the first and second supporting means; means for positioning the means for carrying and the first and second supporting means; means for providing a high vacuum to the means for positioning and the means for carrying; means for providing at least one vacuum level within the means for carrying that is different from the high vacuum in the main vacuum chamber.

According to a further aspect of the invention, a lithographic apparatus is provided comprising: an illumination system constructed to provide a beam of radiation; a support structure constructed to support an object to receive the beam of radiation; a positioning device constructed to position the support structure; a carrier device constructed to support the positioning device; and a main vacuum chamber provided with a first gas evacuating structure to provide a high vacuum, the main vacuum chamber enclosing the support structure, the positioning device, and the carrier device, the carrier device including at least one compartment shielded from the high vacuum of the main vacuum chamber and being provided with a further gas evacuating structure allowing, in operation in the at least one compartment, at least one vacuum level which is different from the high vacuum in the main vacuum chamber.

According to a further aspect of the invention, a method of manufacturing a device is provided, comprising: supporting an object with a support structure; providing a beam of radiation onto the object; positioning the support structure with a positioning device; supporting the positioning device with a carrier device; providing a main vacuum chamber enclosing the support structure, the positioning device, and the carrier device; evacuating the main vacuum chamber to a high vacuum; providing the carrier device with at least one compartment shielded from the high vacuum of the main vacuum chamber; and evacuating the at least one compartment to a vacuum level which is different from the high vacuum in the main vacuum chamber.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective and catadioptric optical components for directing, shaping or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
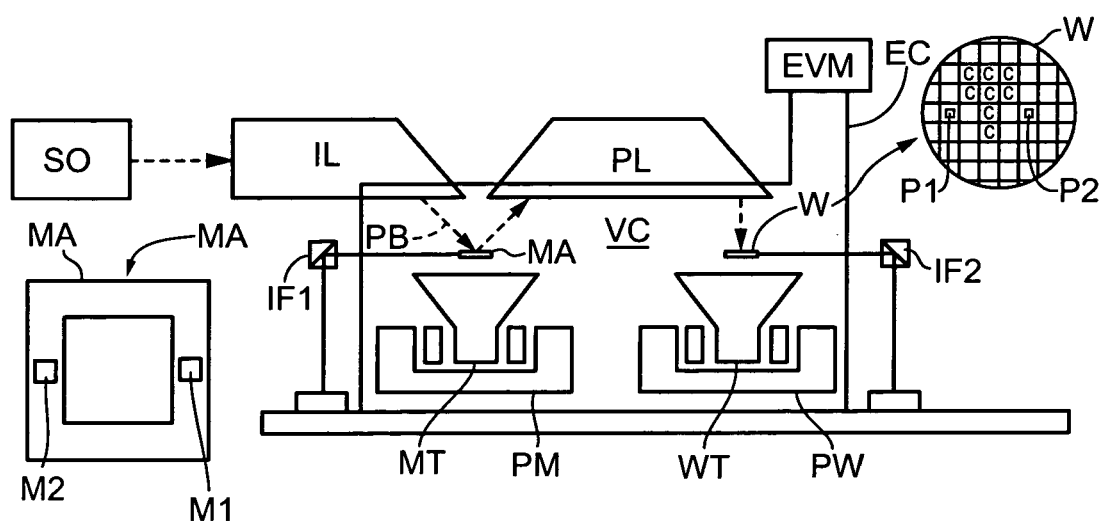
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a projection beam PB of radiation (e.g. UV or EUV radiation); a first object support structure (e.g. a mask table) MT for supporting a patterning device (e.g. a mask) MA and connected to associated positioning structure PM for accurately positioning the patterning device with respect to item PL; a second object support structure which functions as a substrate table (e.g. a wafer table) WT for holding a substrate (e.g. a resist-coated wafer) W and connected to a further positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example in case the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W. With the aid of positioning structure PW and position sensor IF2 (e.g. an interferometric device), the substrate table WT can be moved accurately, e.g. so as to position different target positions C in the path of the beam PB. Similarly, positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structures PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

The object support structures are located in a main vacuum chamber VC which is connected to first gas evacuation structure EVM via a gas evacuation conduit EC. As an alternative, it would be possible to have separate main vacuum chambers for the patterning device support structure and the substrate support structure, respectively.

The first gas evacuation structure EVM is designed to create a high vacuum in the main vacuum chamber(s). The high vacuum may in a practical embodiment for instance be in the order of $10^{-5}$ mbar.

As explained above, such a high vacuum imposes severe requirements on the components that are mounted in the vacuum chamber.

Figure 2:
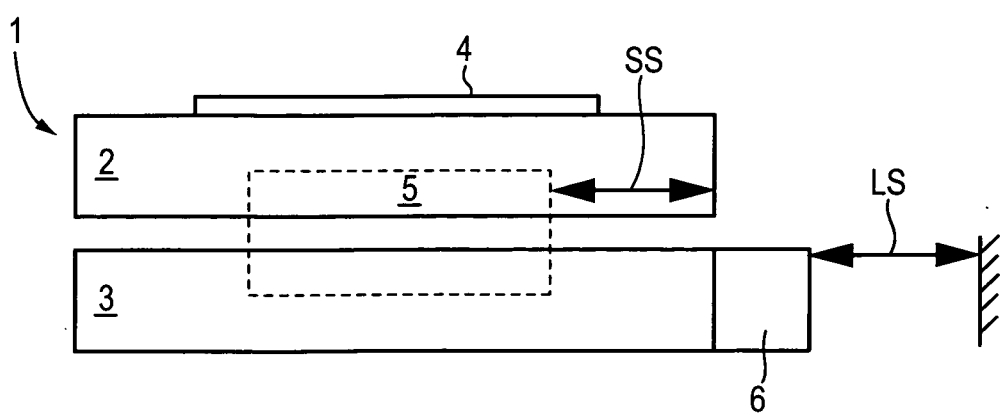
FIG. 2 schematically shows in side elevation an example of an object support structure for use in an apparatus of the type shown in FIG. 1.

FIG. 2 schematically shows in side elevation an example of an object support structure 1, for use in the main vacuum chamber(s) VC of an apparatus as shown in FIG. 1. In this example the object support structure 1 holds the substrate or mask and facilitates measurements for instance by an interferometer system or other measurement system. The object support structure 1 may include two parts, an object table support 2 and an object table 4, but also can be a single part. Object table support 2 may be a mirror block or chuck and the object table 4 may be a wafer table or a mask table.

Further in this example the object support structure 1 is movable over a short distance with respect to the positioning structure PM in one or more degrees of freedom, as indicated by arrow SS.

In this example, the positioning structures PM, PW together with the object support structure 1 are movable in the main vacuum chamber over a much larger distance in one or more degrees of freedom, as indicated by arrow LS. In this example the positioning structure PM, PW includes a long stroke positioning structure 6 and short stroke positioning structure, indicated by a dashed block 5. A carrier 3, supports a short stroke positioning structure 5 and connects both long stroke positioning structure 6 and short stroke positioning structure 5. The carrier 3 carries the positioning structure 5. Suitable long stroke positioning structures 6 are for instance a so called H-drive or Scara, etc. as known in the art.

In this example the short stroke positioning structure 5 is provided for further adjustment of the position of the object table 4 and the object on the table with respect to the projection beam. Basic positioning is provided by the long stroke positioning structure 6 connected to the carrier 3. The short stroke positioning structure 5 may include a number of positioning motors providing one or more dimensional positioning of the supported object.

Figure 3:
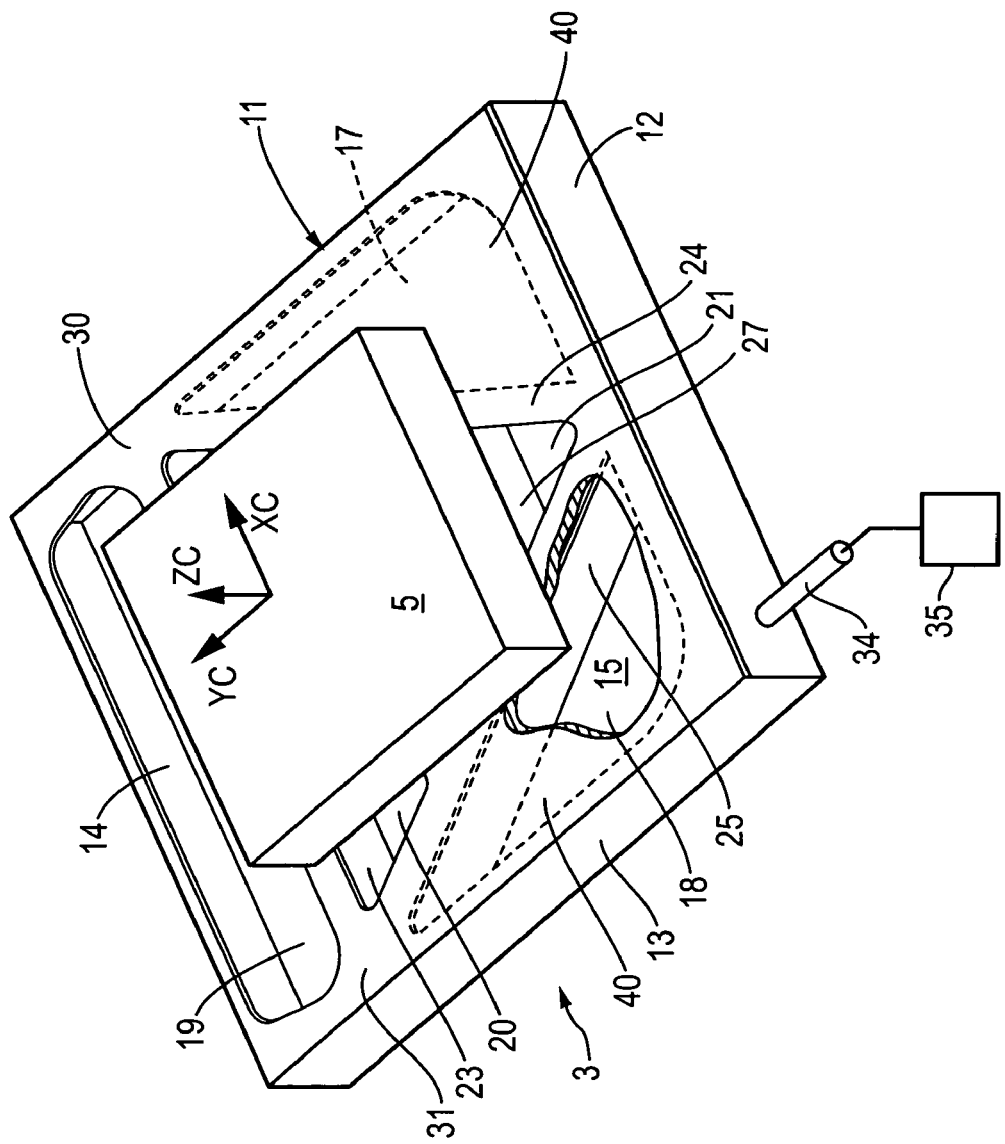
FIG. 3 schematically shows an example of a carrier device of an embodiment of the invention.

FIG. 3 schematically shows an example of an embodiment of a carrier 3 in accordance with the an aspect of the present invention, provided with one or more short stroke positioning structures 5. The carrier 3 may have different shapes, but in the shown embodiment comprises a generally box-like housing, having side walls 11, 12, 13, 14, enclosing a generally rectangular inner space, and a bottom 15. On the side walls connector devices for electric cables, conduits for gas and/or liquids and the like may be mounted (not shown).

Further, the box-like space in the housing is divided in a number of compartments by suitable dividing walls. In the example shown the inner space of the carrier is divided into a number of large compartments as shown at 17, 18, 19 and a number of smaller compartments as shown at 21 by three long dividing walls 23, 24, 25 and short dividing walls like wall 27. The long dividing walls include two walls 24, 25 diverging from a central section of one of the side walls 12 to adjacent side walls 11, 13. The diverging dividing walls 24, 25 meet the respective side walls 11, 13 at points 30, 31 at some distance from the fourth side wall 14. Between the points 30, 31 the third long dividing wall 23 extends, thus defining a generally triangular central compartment within the carrier, as well as a generally triangular peripheral compartment 17 and 18 and a generally rectangular peripheral compartment 19. Further, in this example, at least the lower corner of the central triangular compartment has been "cut off" by the short dividing wall 27 thus providing a four sided central compartment 20 and a small triangular compartment 21. Of course, further or less dividing walls may be used depending upon practical requirements in a specific situation.

The large triangular configuration of the dividing walls 23, 24, 25 together with the side walls provides for a mechanically strong structure able to resist vacuum level differences in different parts of the carrier. Further mechanical strength is obtained by the short oblique dividing wall 27 forming the smaller triangular compartments 21.

The use of a box-like carrier device or in general a carrier device having a number of compartments facilitates a modular design of the support structure.

As shown in FIG. 3, the short stroke positioning structure 5 is mounted in or on the central compartment 20. The short stroke positioning structure 5 may be designed as a unitary motor module comprising a number of positioning motors for adjustment of the object support structure 1 in the X, Y and Z directions as indicated in FIG. 3.

As the object and therefore the object table 4 and the short stroke positioning structure 5 are in the high vacuum space, the central compartment 20 may be in open connection with the high vacuum chamber VC in particular in case the short stroke positioning structure 5 is mounted at least partly in the central compartment 20 of the carrier 3. Thus, the central compartment 20 may have a partly, or even substantially completely open top wall and possibly a partly or substantially completely open bottom wall 15. However, in view of mechanical strength and stiffness considerations, the bottom wall 15 may be designed as a substantially closed wall. Thus, the short stroke positioning structure 5 as well as any conduits and cables connected to it as far as extending in the high vacuum space will be subject to outgassing phenomena. This will also be true for any further auxiliary components that are located so close to the short stroke positioning structure 5 that positioning in the central compartment 20 is necessary.

Any further cables, conduits, electronic devices and further auxiliary components, however, that are associated with the object table 4 and its positioning may be mounted in some or all of the other compartments in which, in use, a higher, but still sub-atmospheric pressure may prevail. Of course such other compartments then should be sealed from the main vacuum space and should have completely closed side walls and completely closed top and bottom walls, excepting any sealed gates through which cables and conduits may extend as seen in FIG. 3 with the enclosed compartment 18, which is enclosed by side walls 12 and 13, dividing wall 25, bottom 15 and top 40. FIG. 3 shows top 40 with a section cut-away to illustrate the interior of compartment 18.

The peripheral compartments may be interconnected so as to form a single low vacuum space connected to a common gas evacuating structure, or may comprise a number of, or groups of, sealed compartments having separate gas evacuating structures if so desired. In the embodiment shown, a gas evacuating connector is schematically shown at 34 in FIG. 3. The vacuum pressure provided by the further gas evacuating structure 35 connected to the gas evacuating connector 34 may be in the order of $10^{-3}$ mbar or an even higher pressure, e.g., $10^{-1}$ mbar. The gas evacuating connector extends through side wall 12 so that further gas evacuating structure 35 can evacuate enclosed compartment 18 to a pressure that is different than that of the main vacuum chamber VC, for example, the enclosed compartment 18 can be evacuated to a low vacuum. Of course, although the illustrated embodiment only shows one compartment 18 enclosed and evacuated by the further gas evacuating structure 35, any number of compartments can be enclosed and evacuated by one or more further gas evacuating structures 35, as desired.

The further gas evacuating structure 35 may be completely separate from the gas evacuating structure EVM providing the main vacuum but, as an alternative the first or main gas evacuating structure EVM and the further gas evacuating structure 35 may share common parts. For instance, the further gas evacuating structure 35 may use the same vacuum pump as the first gas evacuating structure EVM.

The presence of some contaminants in the peripheral compartments is not critical to the lithographic process because the peripheral compartments are shielded from the high vacuum chamber VC, which has a high vacuum level corresponding e.g. with a pressure of $10^{-5}$ mbar.

Further, the requirements for the further gas evacuating structure 35 may be considerably less severe compared to the requirements for the first gas evacuating structure EVM, because of the different vacuum levels.

A further effect of the presence of a relatively high pressure in some components of the carrier is that in such compartments a somewhat enhanced cooling effect occurs if compared to the high vacuum spaces.

It is observed that after having read the preceding specification various modifications will be apparent to a person skilled in the art.

In particular, the shape of the carrier 3, in FIG. 3 shown as generally rectangular, and the number and shape of the compartments in the carrier 3 may be varied. For instance, the carrier device 3 disclosed above and shown in the drawings has a very compact design because of its flat box-like shape and its single layer of compartments. All compartments have dividing walls having an upper longitudinal edge in the top plane of the carrier device 3 and a lower longitudinal edge in the bottom plane of the carrier device 3. However, if expedient, it would be possible to use in one or more compartments a dividing wall which is generally parallel to the top and bottom planes or at least is not perpendicular to the top and bottom planes, so as to obtain sub-compartments at different levels in the carrier device.

Further the carrier 3 may have the shape of a frame surrounded by a number of compartments mounted to the frame. Such a frame may be designed as a kind of backbone carrying the compartments. In the configuration shown in FIG. 3 such a frame may be formed by the generally triangular structure of the walls 23,24,25 and the surrounding compartments would then be the peripheral compartments 17,18,19. Of course in this embodiment the frame is of a triangular shape having at least one internal compartment.

The frame elements like the walls 23,24,25 and/or the walls 11,12,13,14, and/or the upper and lower walls of the various compartments need not be straight or flat. Curved walls like e.g. concave or convex upper and lower walls of the compartments or side walls having e.g. a shape of an outwardly or inwardly turned arc of a circle or the like could be used if so desired. The frame elements may or may not be part of the walls of the various compartments.

Figure 4:
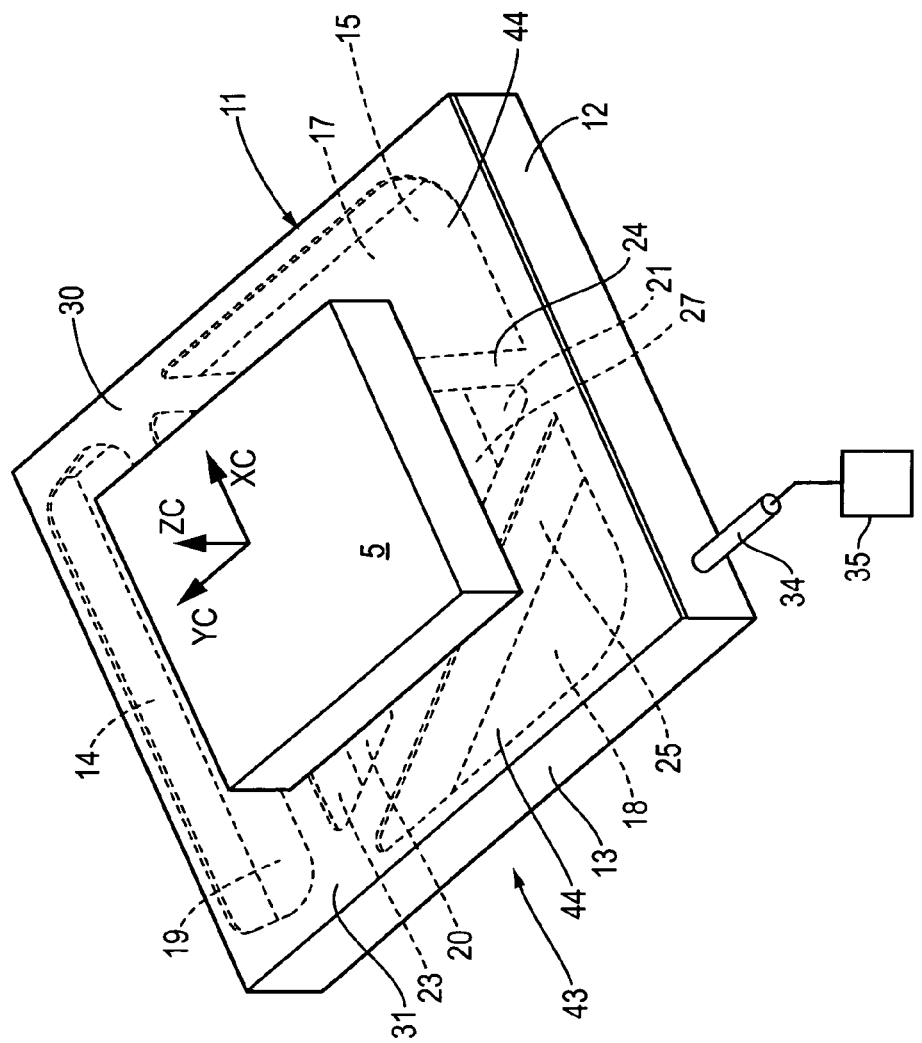
FIG. 4 schematically shows another example of a carrier device of an embodiment of the invention.

As indicated above one or more of the compartments may be in open connection with the main vacuum chamber EVM. However, a carrier 3 in accordance with an embodiment of the present invention does not need to have such open compartments. As seen in FIG. 4, all of the compartments 19, 17, 21, 20, and 18 may be closed from the main vacuum chamber EVM by top 44.

Further, in the embodiment of FIGS. 2 and 3 the carrier device 3 carries a short stroke positioning structure 5. However an aspect of the invention also contemplates a carrier device which does not support such short stroke positioning structure. In general aspects of the invention may be used irrespective of the type and location of the positioning structure for the object table.

Also instead of a dual vacuum arrangement a multiple vacuum arrangement may be used, wherein a plurality of different vacuum levels in corresponding compartments are used.

What is claimed is:

1. A lithographic apparatus comprising:
    an illumination system constructed to provide a beam of radiation;
    at least one first object support structure constructed to support a patterning device, said patterning device serving to impart a cross-section of said beam with a pattern to form a patterned beam;
    at least one second object support structure constructed to support a substrate;
    a projection system that projects said patterned beam onto a target portion of said substrate; and
    at least one main vacuum chamber provided with a first gas evacuating structure to provide a high vacuum, said main vacuum chamber enclosing at least one of said first and second support structures and enclosing positioning structures having at least one positioning device and associated with at least one of said first and second support structures,
    wherein said at least one of said first and second support structures in said main vacuum chamber includes a carrier device connected to said at least one positioning device and being within said main vacuum chamber,
    wherein said carrier device includes at least one compartment shielded from said high vacuum of said main vacuum chamber and being provided with a further gas evacuating structure allowing, in operation in said at least one compartment, at least one vacuum level which is different from said high vacuum in said main vacuum chamber.

2. A lithographic apparatus according to claim 1, wherein said carrier device includes a frame provided with said at least one compartment.

3. A lithographic apparatus according to claim 2, wherein said frame is a backbone frame to which compartments shielded from said vacuum chamber are mounted.

4. A lithographic apparatus according to claim 3, wherein said frame surrounds multiple compartments shielded from said vacuum chamber.

5. A lithographic apparatus according to claim 1, wherein said carrier device is a box, wherein an inner space of said box is divided into compartments by dividing walls.

6. A lithographic apparatus according to claim 1, wherein said carrier device includes at least one compartment which is in open connection with said main vacuum chamber.

7. A lithographic apparatus according to claim 1, wherein said carrier device has an inner space and dividing walls dividing said inner space of said carrier device into a central compartment and peripheral compartments, said central compartment being in open connection with said main vacuum chamber and a plurality of said peripheral compartments being shielded from said main vacuum chamber, each of said plurality of said peripheral compartment having at least one vacuum level which is different from said high vacuum in said main vacuum chamber.

8. A lithographic apparatus according to claim 1, wherein said carrier device has a plurality of shielded compartments and wherein at least two of said shielded compartments are in open connection with each other so as to constitute at least one single vacuum space having at least one vacuum level which is different from said high vacuum in said main vacuum chamber.

9. A lithographic apparatus according to claim 7, wherein said carrier device is shaped as a flat box having a top plane and a bottom plane wherein said dividing walls have upper and lower edges in said top and bottom planes of said flat box, respectively.

10. A lithographic apparatus according to claim 7, wherein
said carrier device has a generally rectangular shape formed by four side walls and wherein said dividing walls include three walls constituting a triangular compartment having three corners, wherein each of said three corners lie on a different side wall of said four side walls.

11. A lithographic apparatus according to claim 10, wherein
at least one of said corners of said triangular compartment forms a corner section that is cut short by a short dividing wall extending between two of said three walls of said triangular compartment.

12. A lithographic apparatus according to claim 6, wherein
one of said at least one positioning device to position said supported object is mounted in said compartment in open connection with said main vacuum chamber.

13. A lithographic apparatus according to claim 6, wherein
one of said at least one positioning device to position said supported object is mounted on top of a carrier device without open compartments.

14. A method of manufacturing a device comprising:
providing a beam of radiation;
imparting a cross-sectional pattern to the beam and forming a patterned beam of radiation while a first object support structure supports a patterning device;
projecting the patterned beam onto a target portion of a substrate supported by a second object support structure;
providing a high vacuum within at least one main vacuum chamber, the main vacuum chamber enclosing at least one of the first and second object support structures and enclosing a positioning structure having at least one positioning device and associated with at least one of the first and second object support structures;
positioning a carrier device, included within one of the first and second object support structures, to position the carrier device in the main vacuum chamber,
providing at least one vacuum level which is different from the high vacuum in the main vacuum chamber within at least one compartment within the carrier device that is shielded from the high vacuum of the main vacuum chamber.

15. A lithographic apparatus comprising:
means for providing a beam of radiation;
pattern-forming means for imparting a cross-sectional pattern to said beam of radiation to form a patterned beam;
first supporting means for supporting said pattern-forming means;
a substrate;
second supporting means for supporting said substrate;
means for projecting said patterned beam onto a target portion of said substrate;
means for carrying said first and second supporting means;
means for positioning said means for carrying and said first and second supporting means;
means for providing a high vacuum to a main vacuum chamber that encloses said for carrying;
means for providing at least one vacuum level within said means for carrying that is different from said high vacuum in said main vacuum chamber.

16. A lithographic apparatus comprising:
an illumination system constructed to provide a beam of radiation;
a support structure constructed to support an object to receive said beam of radiation;
a positioning device constructed to position said support structure;
a carrier device constructed to support said positioning device; and
a main vacuum chamber provided with a first gas evacuating structure to provide a high vacuum, said main vacuum chamber enclosing said support structure, said positioning device, and said carrier device,
said carrier device including at least one compartment shielded from said high vacuum of said main vacuum chamber and being provided with a further gas evacuating structure allowing, in operation in said at least one compartment, at least one vacuum level which is different from said high vacuum in said main vacuum chamber.

17. A method of manufacturing a device, comprising:
supporting an object with a support structure;
providing a beam of radiation onto the object;
positioning the support structure with a positioning device;
supporting the positioning device with a carrier device;
providing a main vacuum chamber enclosing the support structure, the positioning device, and the carrier device;
evacuating the main vacuum chamber to a high vacuum;
providing the carrier device with at least one compartment shielded from the high vacuum of the main vacuum chamber; and
evacuating the at least one compartment to a vacuum level which is different from the high vacuum in the main vacuum chamber.

* * * * *

UNITED STATES PATENT AND TRADEMARK OFFICE
CERTIFICATE OF CORRECTION

PATENT NO.       : 7,034,924 B2
APPLICATION NO.  : 10/754634
DATED            : April 25, 2006
INVENTOR(S)      : Harmen Klaas Van Der Schoot et al.

It is certified that error appears in the above-identified patent and that said Letters Patent is hereby corrected as shown below:

On title page, item 73 Assignee
  replace "ASLM Netherlands B.V., Veldhoven (NL)"
  with --ASML Netherlands B.V., Veldhoven (NL)--.

Signed and Sealed this

Twenty-first Day of November, 2006

JON W. DUDAS
*Director of the United States Patent and Trademark Office*